(12) United States Patent
Katti et al.

(10) Patent No.: US 6,219,273 B1
(45) Date of Patent: Apr. 17, 2001

(54) INTEGRATED SEMICONDUCTOR-MAGNETIC RANDOM ACCESS MEMORY SYSTEM

(75) Inventors: Romney R. Katti, Maple Grove, MN (US); Brent R. Blaes, San Dimas, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/260,920

(22) Filed: Mar. 2, 1999

Related U.S. Application Data
(60) Provisional application No. 60/076,524, filed on Mar. 2, 1998.

(51) Int. Cl.[7] .................................................. G11C 11/00
(52) U.S. Cl. ............................................ 365/158; 365/171
(58) Field of Search ...................................... 365/158, 171, 365/173, 55

(56) References Cited

U.S. PATENT DOCUMENTS

| | | | |
|---|---|---|---|
| 5,289,410 | 2/1994 | Katti et al. | 365/170 |
| 5,659,499 | 8/1997 | Chen et al. | 365/158 |
| 5,946,227 | * 8/1999 | Naji | 365/158 |

* cited by examiner

Primary Examiner—A. Zarabian
(74) Attorney, Agent, or Firm—Fish & Richardson P.C.

(57) ABSTRACT

The present disclosure describes a non-volatile magnetic random access memory (RAM) system having a semiconductor control circuit and a magnetic array element. The integrated magnetic RAM system uses CMOS control circuit to read and write data magnetoresistively. The system provides a fast access, non-volatile, radiation hard, high density RAM for high speed computing.

11 Claims, 9 Drawing Sheets

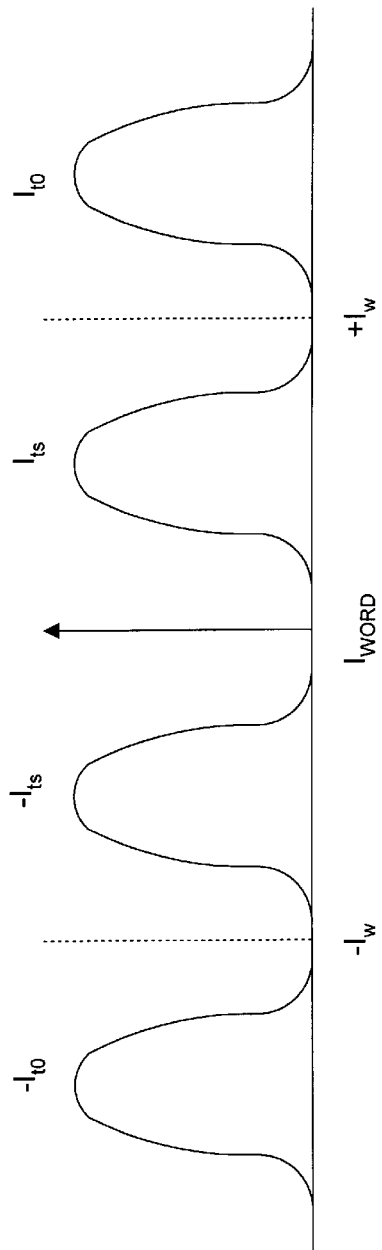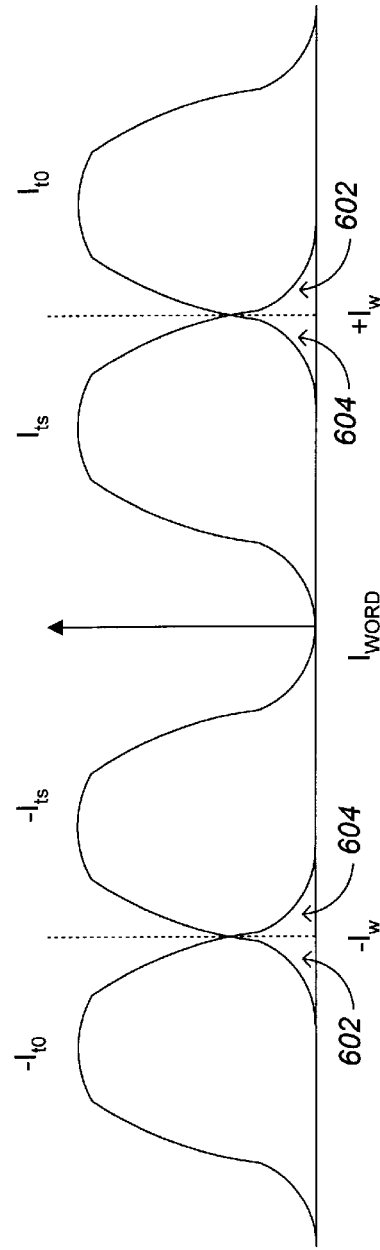

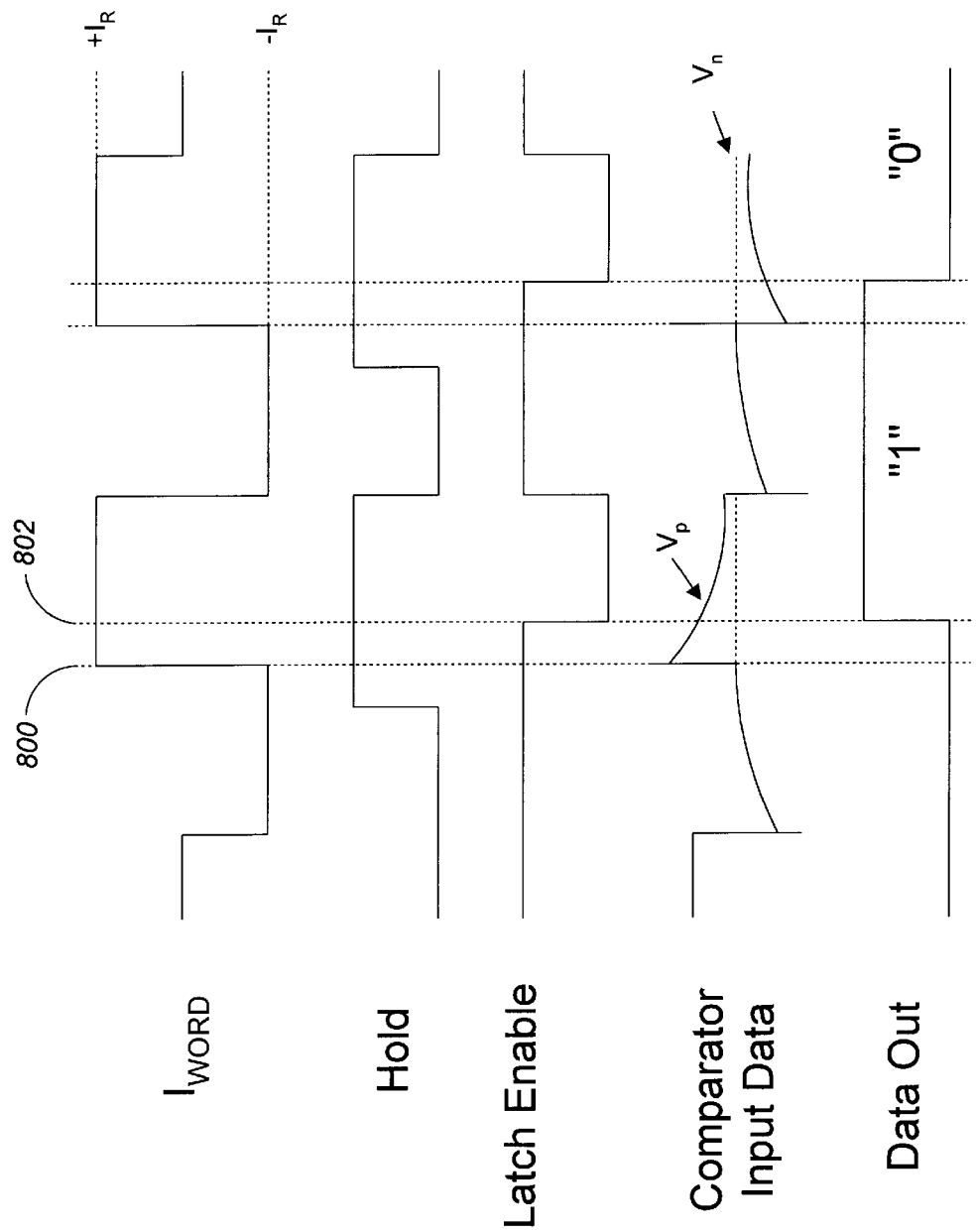

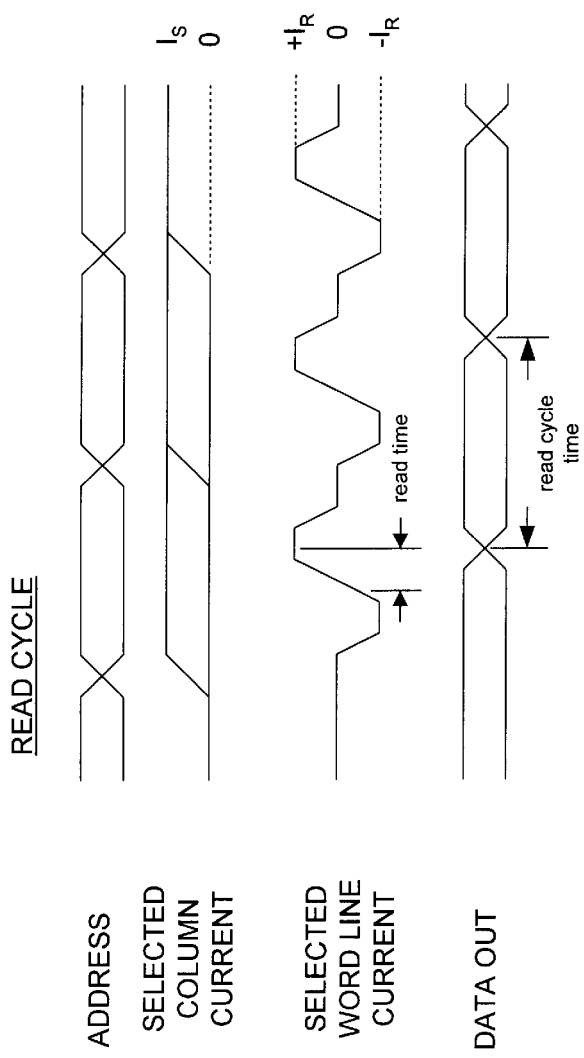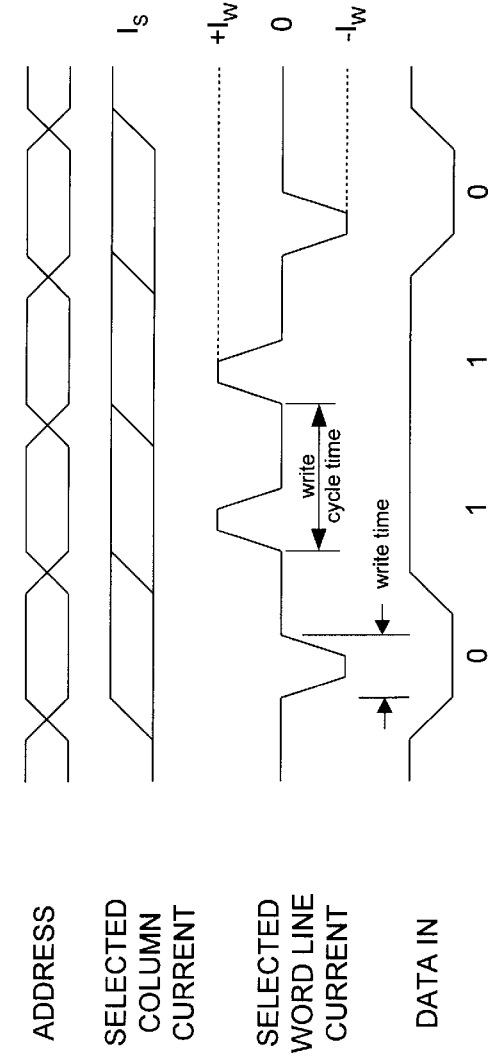

INTEGRATED SEMICONDUCTOR-MAGNETIC RANDOM ACCESS MEMORY SYSTEM

CROSS-REFERENCE TO RELATED APPLICATIONS

This application claims benefit of the priority of U.S. Provisional Application Serial No. 60/076,524, filed Mar. 2,1998 and entitled "JPL's Magnetic Random Access Memory: MagRAM."

ORIGIN OF INVENTION

The invention described herein was made in performance of work under a NASA contract, and is subject to the provisions of Public Law 96-517 (35U.S.C. 202) in which the Contractor has elected to retain title.

BACKGROUND

The present specification generally relates to memory devices. More particularly, the present specification describes an integrated semiconductor-magnetic random access memory.

A demand for increase in data processing rate has led to search for faster and denser random access memory (RAM). Semiconductor memories such as dynamic RAM and static RAM have very fast access times but are also volatile. Electrically erasable read only memories (EPROM) are non-volatile but have very long write times and offer a conflict between refresh needs and radiation tolerance.

The concept of using magnetic material for a non-volatile RAM has been implemented before, e.g., in core memory and in magnetic RAM. A non-volatile magnetic random access memory is described in U.S. Pat. No. 5,289,410, the disclosure of which is herein incorporated by reference to the extent necessary for understanding.

SUMMARY

The present disclosure describes a non-volatile magnetic random access memory (RAM) system having a semiconductor control circuit and a magnetic array element. The integrated magnetic RAM system uses a CMOS control circuit to read and write data magnetoresistively. The system provides a fast access, non-volatile, radiation hard, high density RAM for high speed computing.

According to the present disclosure, magnetic storage array cells have certain hysteresis characteristic that allows data to be written to or read from the cell accurately without interference from surrounding cells. Semiconductor circuits operate to read data from and write data to the magnetic storage array cells by generating currents to apply electromagnetic fields to the cells. A preferred embodiment of the magnetic array cells uses magnetoresistive material.

A method for writing data to the magnetic memory array cells includes selecting cell address and applying appropriate currents to address lines.

The details of one or more embodiments are set forth in the accompanying drawings and the description below. Other embodiments and advantages will become apparent from the following description and drawings, and from the claims.

BRIEF DESCRIPTION OF THE DRAWINGS

These and other aspects will be described in reference to the accompanying drawings wherein:

FIG. 6A shows distribution of switching thresholds in a memory array with no overlap of thresholds;

FIG. 6B shows distribution of switching thresholds in a memory array with overlap of thresholds;

FIG. 8 shows a timing diagram of a read process;

FIG. 9A shows a more detailed timing diagram of a read cycle; and

FIG. 9B shows a detailed timing diagram of a write cycle.

Like reference numbers and designations in the various drawings indicate like elements.

DETAILED DESCRIPTION

The advantageous features of a magnetic RAM include fast access, non-volatility, radiation hardness, and high density. The inventors found that by using the integrated semiconductor-magnetic elements, all the advantageous features of the magnetic RAM can be achieved at lower cost and having a faster access time.

Figure 1:
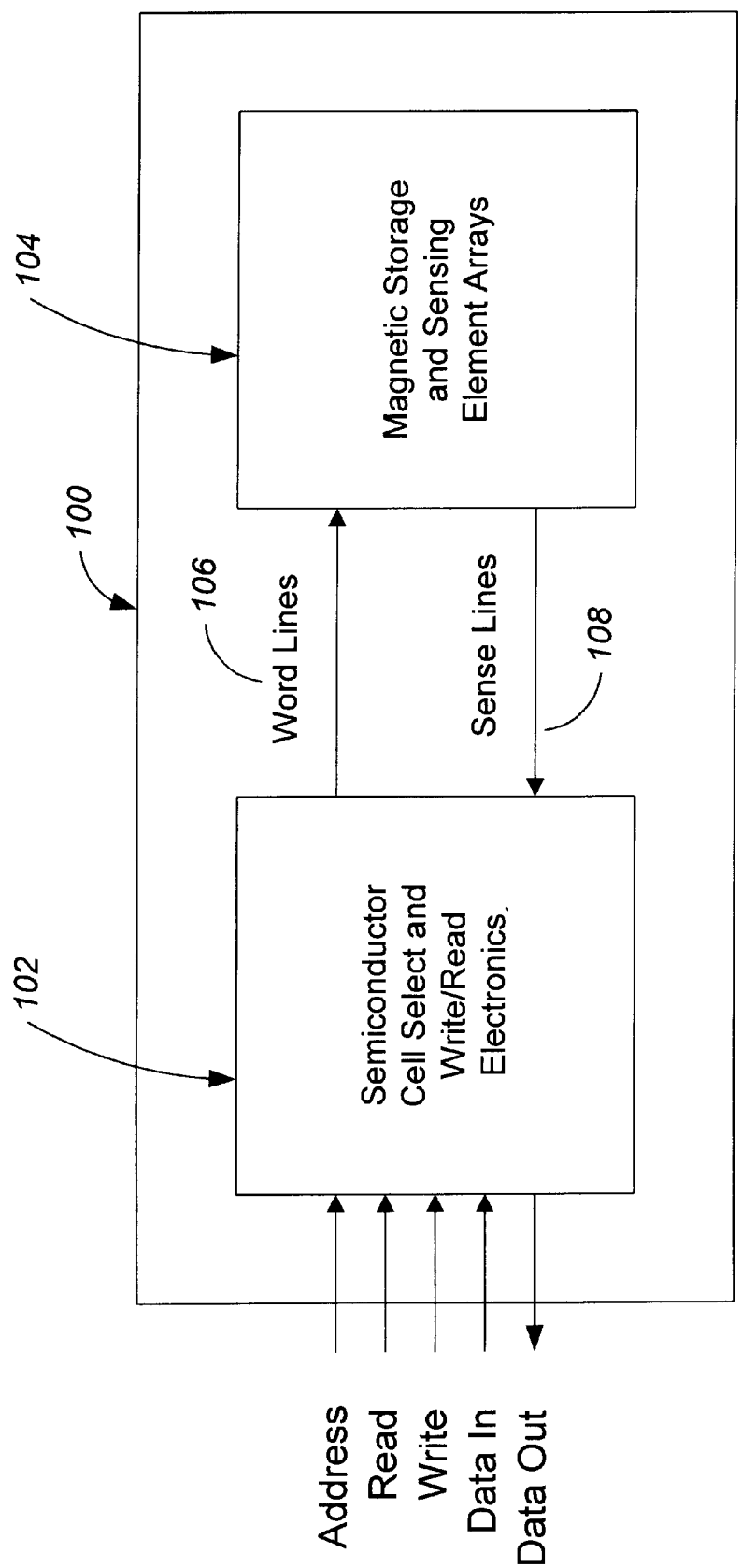
FIG. 1 shows a block diagram of an integrated semiconductormagnetic random access memory (RAM) system.

A block diagram of a preferred embodiment of the integrated semiconductor-magnetic RAM system, showing data inputs and outputs for semiconductor electronics and magnetic elements, is shown in FIG. 1. The magnetic elements are used for storing and sensing data. The preferred magnetic array element used for data storage is described in U.S. Pat. No. 5,659,499.

The integrated system 100 writes and reads data to and from the magnetic elements 104 magnetoresistively using hysteresis characteristics. The semiconductor electronics 102 perform magnetic element array addressing, voltage sense amplifying, and data latching functions. Currents in word lines generate magnetic fields to write data. The data signals on sense lines are amplified and converted to digital form.

Figure 2:
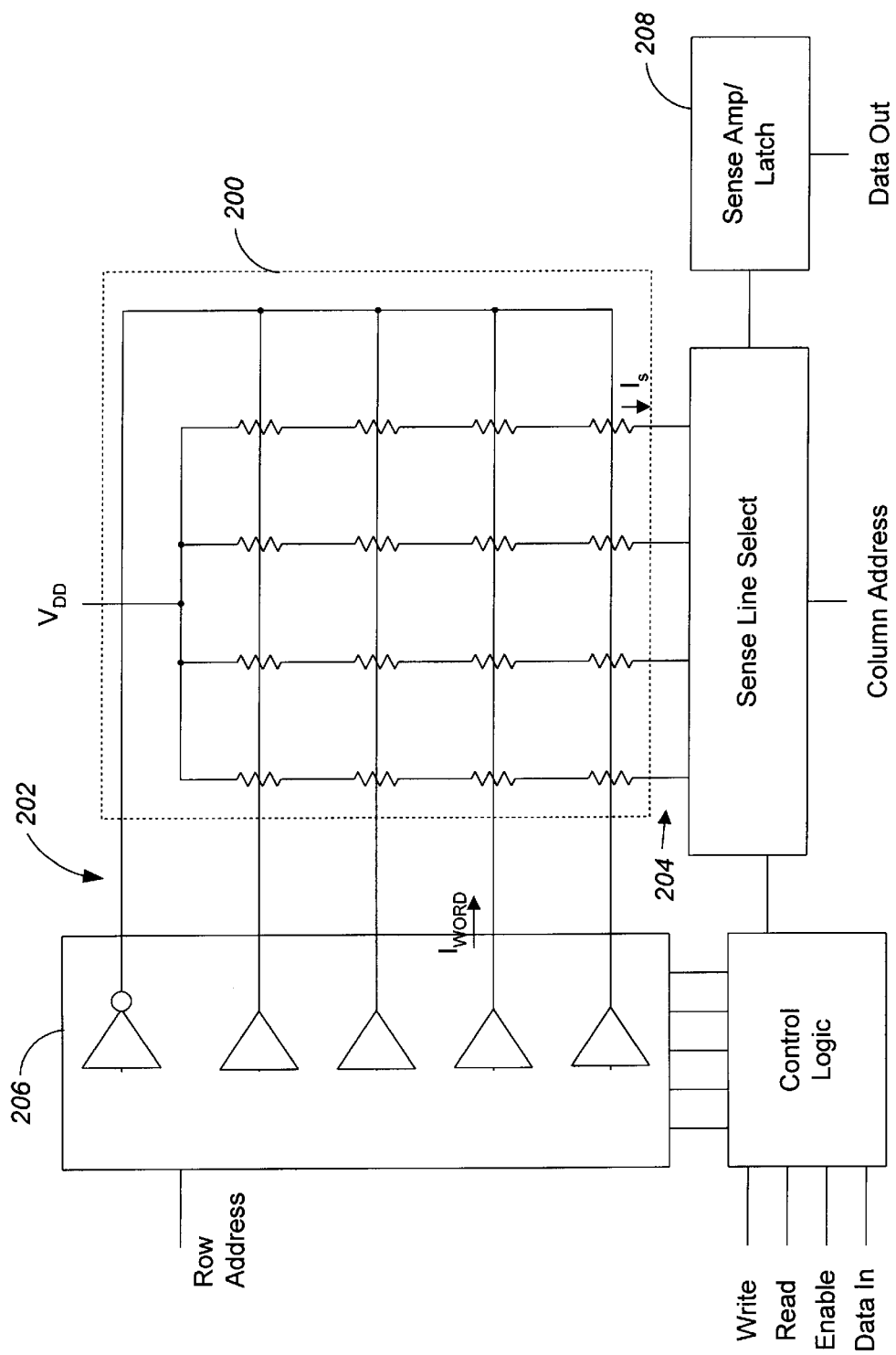
FIG. 2 shows a more detailed block diagram of the integrated system showing an array of magnetoresistive elements.

FIG. 2 shows a more detailed block diagram of the integrated system showing an array of magnetoresistive elements 200. The word lines 202 and sense lines 204 form row and column addresses respectively. The word lines 202 and sense lines 204 address and access the array of magnetoresistive elements 200. The word line 202 applies approximately 15 to 25 mA of current to read the data and approximately 40 to 50 mA to write the data. The sense line 204 applies approximately 2 mA of current. The areal density of the integrated semiconductor-magnetic RAM chip is mainly determined by the semiconductor electronics 102 rather than the magnetic elements 104 because the word-line and the sense-line sizes are determined by the dimensions of the current drivers 206 and sense amplifiers 208.

Figure 3:
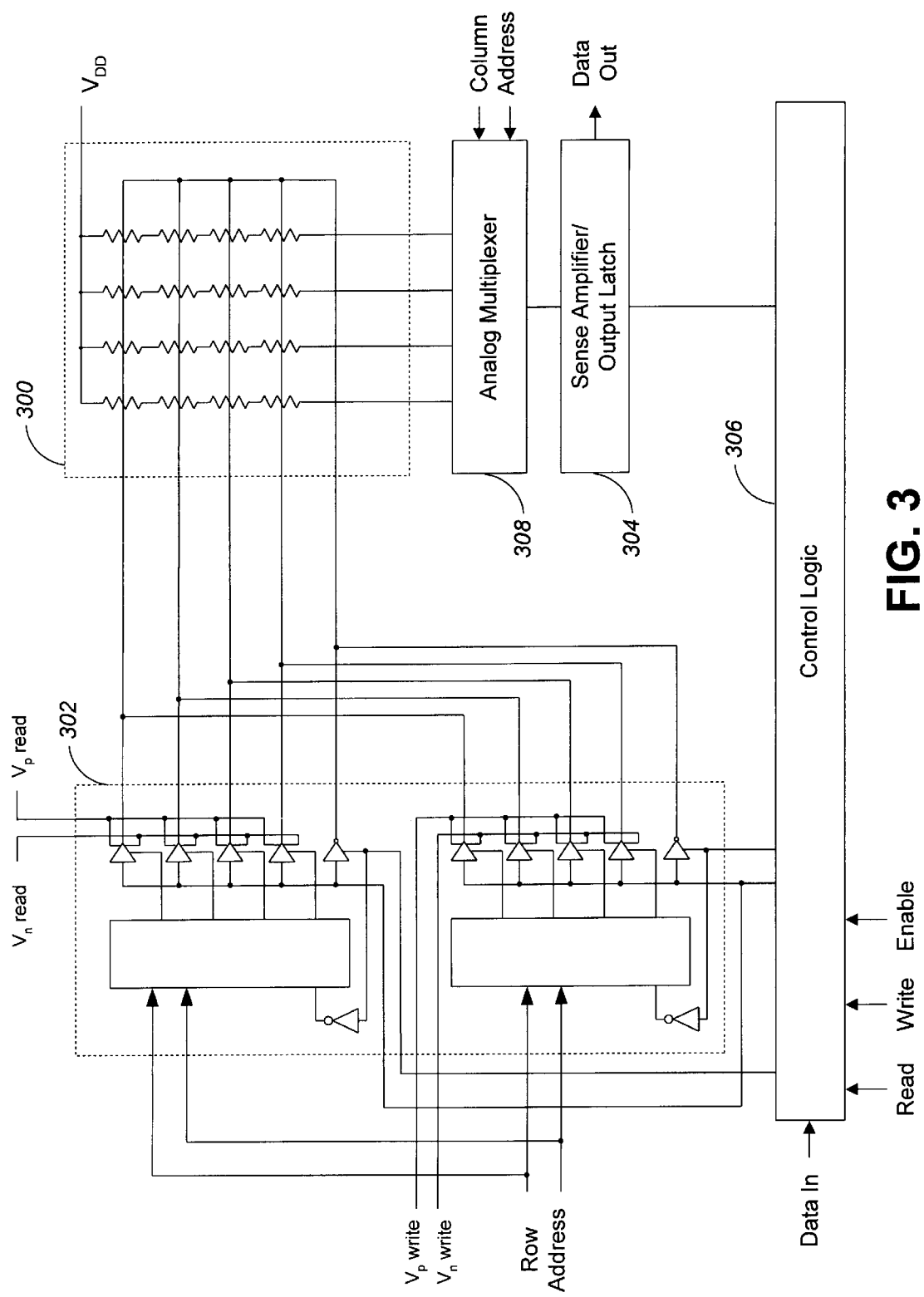
FIG. 3 shows a schematic diagram of the integrated semiconductor-magnetic RAM system containing a 4×4 magnetic memory array.

FIG. 3 is a schematic diagram of one embodiment of the integrated semiconductor-magnetic RAM system having a 4×4 magnetic memory array 300, a CMOS active memory array chip 302, analog amplification electronics 304, and digital control electronics 306. The CMOS array 302 controls row addresses and supplies word current. An analog multiplexer 308 controls column addresses.

Figures 4A, 4B:
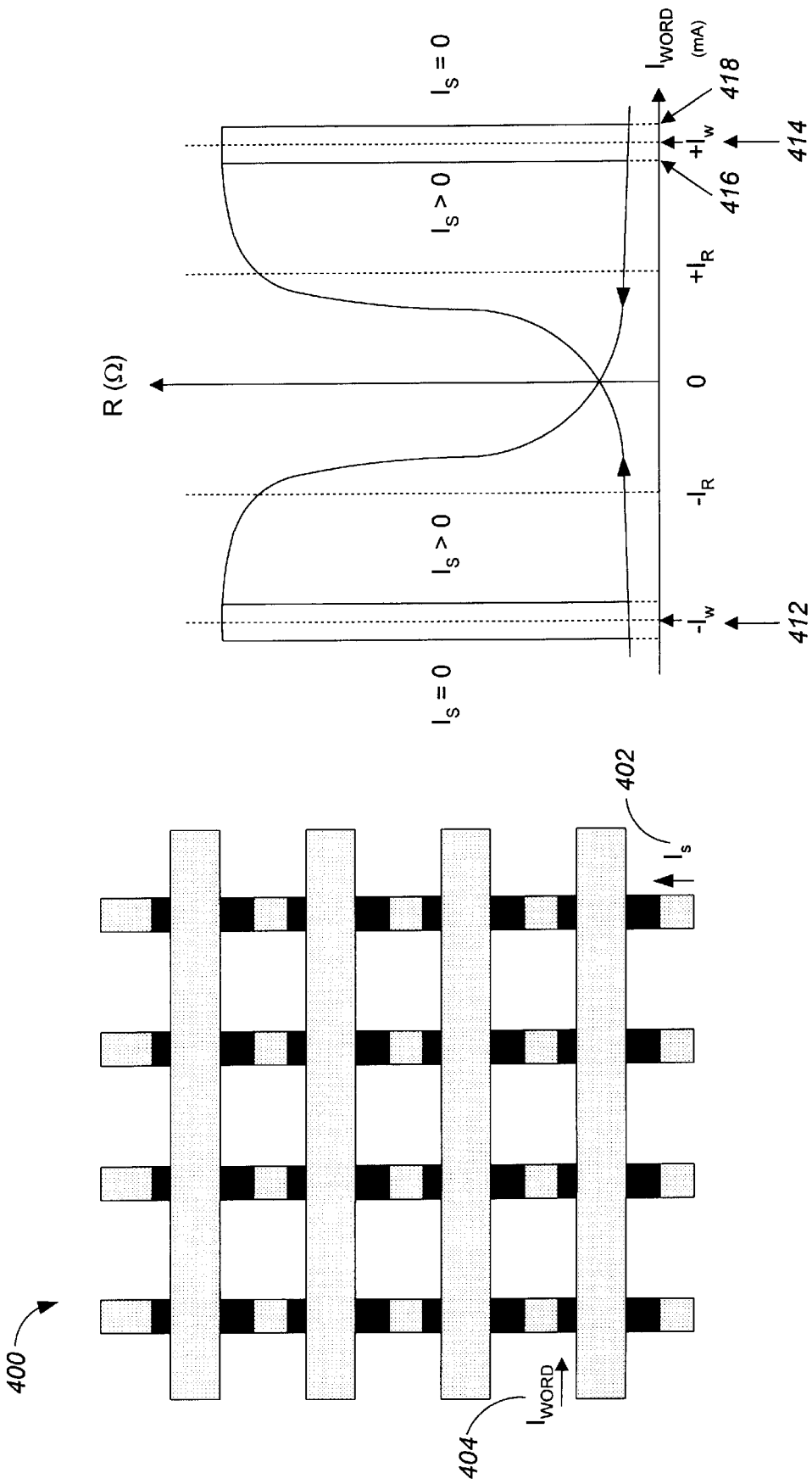
FIG. 4A shows a layout of the magnetic element array.
FIG. 4B shows a resistance hysteresis curve of a magnetic bit operating to write data.

FIG. 4A shows a layout of the magnetic element array 400. The array 400 is arranged in a 4×4 configuration allowing 16 bits to be addressed. The currents $I_{WORD}$ 404 and $I_S$ 402 on word line and sense line respectively are used for addressing during read and write cycles.

FIG. 4B shows a resistance hysteresis curve of a magnetic bit. operating to write or read data. Writing occurs when a sense current 402, $I_S$, is applied to the sense line and a word current 404, $I_{WORD}$, is applied to the word line. A "0" bit is written to a magnetoresistive memory cell when the word current 404 applied is $+I_W$, 412. A "1" bit is written when the word current 404 applied is $-I_W$ 414. Nondestructive reading occurs when a sense current 402, $I_S$, is applied to the sense line and a negative read current followed by a positive read current is applied to the word line.

To write to an addressed bit corresponding to a specific memory cell, the magnitude of the word current 404 must be greater than the magnitude of a switching threshold with non-zero sense current 416 of the cell on an active sense line, $I_{ts}$. However, the magnitude of the word current 404 on inactive sense lines must be less than a "zero sense current" switching threshold 418, $I_{t0}$, to avoid an erroneous write. Therefore, the word current 404 has a write margin which is half of the magnitude of the difference between the zero sense current threshold 418 and the non-zero sense current threshold 416. The hysteresis characteristics allow the widening of the write margin by decreasing the non-zero sense current threshold 416 as sense current 402 increases.

Figure 5:
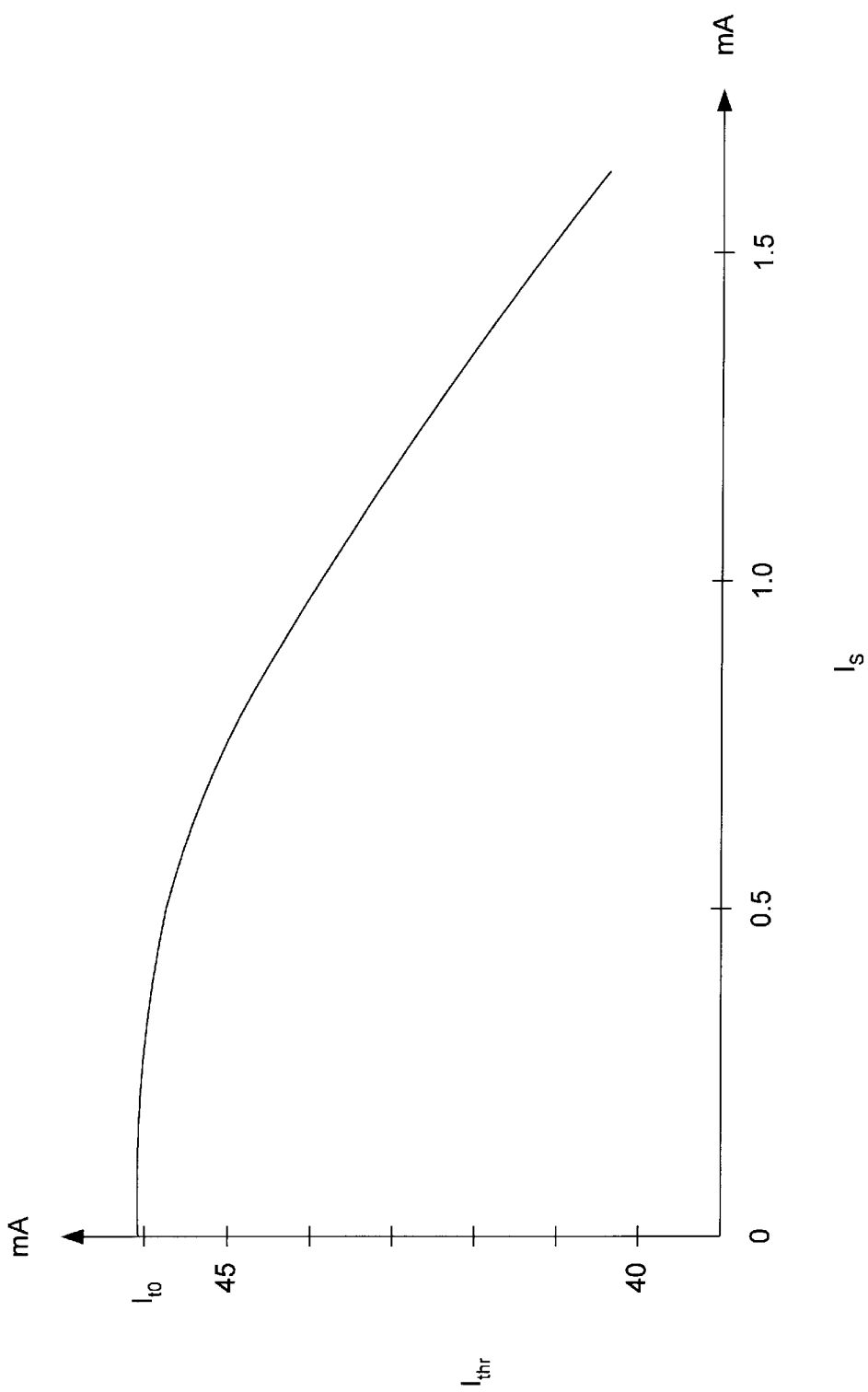
FIG. 5 shows a plot of memory state switching threshold versus sense current.

FIG. 5 shows a plot showing how the switching threshold decreases as the sense current 402 increases. The decrease in the switching threshold of the cell crossed by the active sense line 402 allows data to be written while the other cells crossed by the active word line 404 will not be written but will retain their memory. Correct write/read functionality of all cells in the memory array requires that the word current 404 magnitude be larger than the memory cell with the largest non-zero sense current threshold 416, but smaller than the memory cell with the smallest zero sense current threshold 418.

FIGS. 6A and 6B show the distribution of the switching thresholds of the memory cells in a memory array. FIG. 6A shows no overlap of the distribution of the zero sense current 418 and the non-zero sense current thresholds 416. The memory array of FIG. 6A is fully functional because it has write margin for the worst-case pair of memory cells.

FIG. 6B, on the other hand, has no write margin for the cells corresponding to the overlapping region of the switching threshold distributions. The cells with the magnitude of the zero sense current threshold 418 less than the magnitude of the word current 404 could change their state erroneously 604. Cells with the magnitude of the non-zero sense current greater than the magnitude of the word current cannot change their state 602. Therefore, the distribution of the memory cells with the switching thresholds like FIG. 6A is desired.

Figure 7:
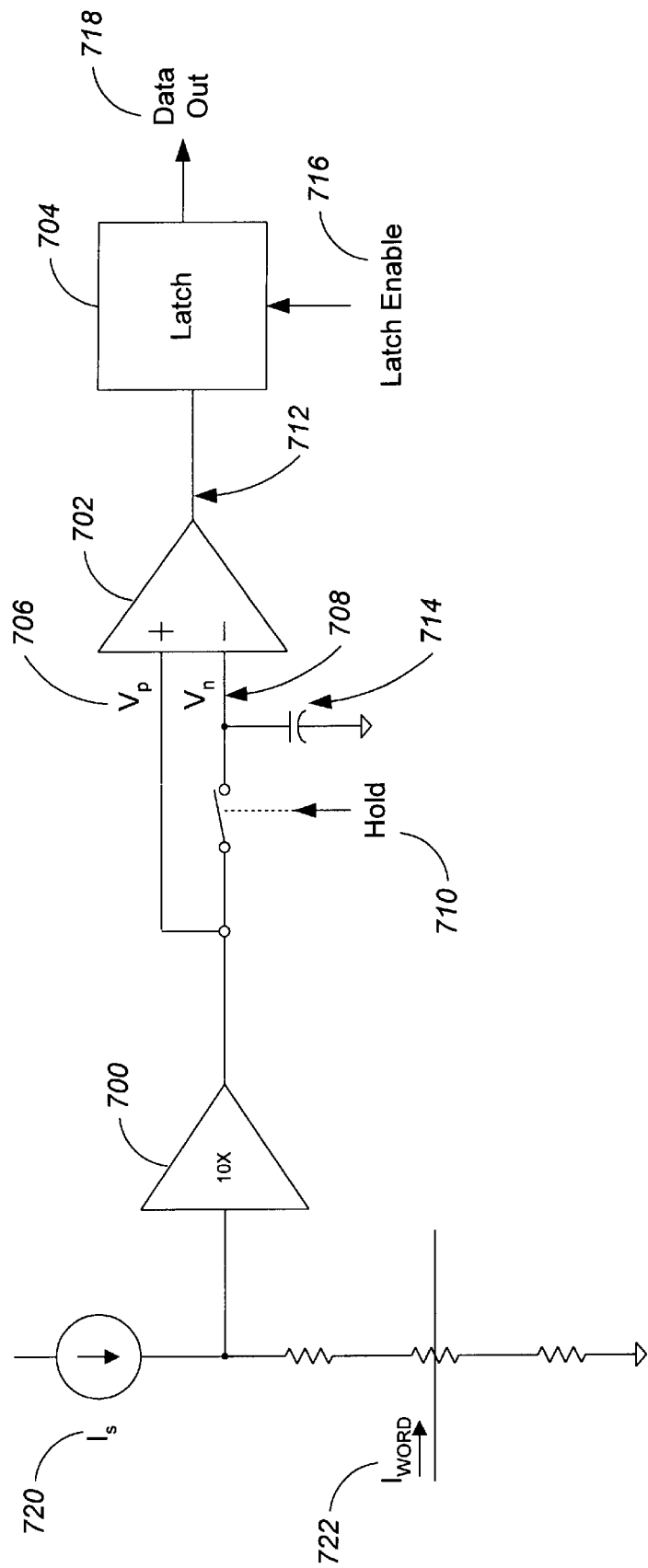
FIG. 7 shows a schematic diagram of a voltage sense amplifier, sample and hold, a comparator and a data latch operating to read data from a memory array.

FIG. 7 shows a schematic diagram of the memory read electronics which consists of a voltage sense amplifier 700, a sample and hold employing capacitor 714 and switch controlled by Hold signal 710, a comparator 702 and a data latch 704.

A nondestructive read consists of a three-phase cycle. During the first phase, the voltage developed across the column of cells passing $I_S$ 720, while the word current is at $-I_R$, is amplified 700 and held on capacitor 714 by opening switch controlled by Hold signal 710. The voltage held, $V_n$ 708, functions as a reference level for the comparator 702. During the second phase, the word current is switched to $+I_R$ and causes the resistance of the selected cell 724 to decrease if it contains a "0" or to increase if it contains a "1". This change in resistance is seen in the hysteresis curves shown in FIG. 4B. The change in resistance is converted to a change in voltage by sense current $I_S$ 720, and amplified 700 to generate the read signal, $V_p$ 706. The read signal, $V_p$ 706, is compared to the reference level, $V_n$ 708, by comparator 702 generating a digital signal 712. A positive change in voltage $V_p$ 706 results in an output voltage 712 corresponding to a digital "1" and a negative change in voltage $V_p$ results in a digital "0". The final phase consists of latching the digital value 712 to the data out pin 718 when a Latch Enable signal 716 is asserted.

FIG. 8 shows the timing diagram of the read process. While the word current is $-I_R$ the Hold signal 710 is activated after signal $V_n$ has stabilized. Next, the word current transitions from $-I_R$ to $+I_R$ at 800 generating read signal $V_p$. The comparator 712 generates a digital output 712 based on the values of $V_p$ and $V_p$. Finally, the digital value is latched to complete the read cycle.

FIGS. 9A and 9B show timing diagrams of the read and the write processes respectively. The advantageous features of the hybrid semiconductor-magnetic RAM system include high density, low power and fast read-write operations. Read and write cycle times of 50 and 20 nanoseconds, respectively, are achievable. Also, virtually no power is consumed during a standby mode while the active power consumption is held to below 100 mW.

Although only a few embodiments have been described in detail above, those of ordinary skill in the art certainly understand that modifications are possible. All such modifications are intended to be encompassed within the following claims, in which:

What is claimed is:

1. A random access memory system comprising:
   a plurality of magnetic storage array cells, each cell having a hysteresis characteristic, such that data can be written to or read from said cell, without interference from other cells, said magnetic storage array cells also having a characteristic that enables retention of data when power is shut off; and
   a control circuit operative to read data from and write data to said plurality of magnetic storage array cells, said control circuit generating currents to apply electromagnetic fields to the plurality of magnetic storage array cells, including
   a first current applied to a first line of said cell that lowers a switching threshold value of the cell, and
   a second current of a predetermined amount applied to a second line of said cell in a particular manner for reading or writing,
   wherein writing occurs when said first and second currents are applied to said first and second lines, and reading occurs when said first current is applied to the first line and a negative current followed by a positive current is applied to the second line.

2. The system of claim 1, wherein said magnetic storage array cells utilize magnetoresistive material.

3. The system of claim 1, wherein said control circuit includes:

a first circuit operating to generate the first current, such that said first circuit selects a column address of said cell; and a second circuit operating to generate the second current, said second circuit selecting a row address of said cell, such that the second circuit applies the second current of a particular polarity to write either a logic high or a logic low to the cell, and the second current of a particular polarity followed by an opposite polarity to read data from the cell.

4. The system of claim 3, wherein the first circuit is an analog multiplexer that sinks a predetermined amount of current on the first line of a selected column chosen by the column address.

5. The system of claim 3, wherein the second circuit is a plurality of current drivers, said second circuit selecting a current driver to generate the second current according to the row address.

6. The system of claim 3, further comprising:

a third circuit operatively coupled to said second circuit, said third circuit reading and converting output voltage from said cell to corresponding digital output voltage.

7. A method for writing data to a magnetic memory array of cells, each cell having a first line and a second line, said method comprising:

selecting a cell to receive the data;

determining a state of data to be written and a polarity of data corresponding to said state;

applying a predetermined amount of current to the first line of said cell that lowers a threshold value of said cell; and applying a current of a particular polarity to the second line of said cell address, wherein writing occurs when said predetermined amount of current is applied to said first line and said current of said particular polarity is applied to said second line, and reading occurs when said predetermined amount of current is applied to the first line and a negative current followed by a positive current is applied to the second line.

8. The method of claim 7, wherein a positive current is applied to the second line to write a logic high and a negative current is applied to the second line to write a logic low.

9. The method of claim 7, wherein a negative current is applied to the second line to write a logic high and a positive current is applied to the second line to write a logic low.

10. A method for reading data from a magnetic memory array cells, each cell having a first line and a second line, said method comprising:

selecting a cell;

applying a predetermined amount of current to said first line of the cell;

applying a current of a particular polarity to said second line of the cell in a particular manner for reading or writing;

sensing output voltage read from the cell; and converting the output voltage to corresponding digital output voltage, wherein writing occurs when said predetermined amount of current is applied to said first line and said current of said particular polarity is applied to said second line, and reading occurs when said predetermined amount of current is applied to the first line and a negative current followed by a positive current is applied to the second line.

11. The method of claim 10, further comprising:

latching said output voltage to be processed in a microprocessor.

* * * * *